United States Patent [19]

Fogal et al.

[11] Patent Number: 5,323,060
[45] Date of Patent: Jun. 21, 1994

[54] MULTICHIP MODULE HAVING A STACKED CHIP ARRANGEMENT

[75] Inventors: Rich Fogal; Michael B. Ball, both of Boise, Id.

[73] Assignee: Micron Semiconductor, Inc., Boise, Id.

[21] Appl. No.: 71,580

[22] Filed: Jun. 2, 1993

[51] Int. Cl.$^5$ ............... H01L 23/16; H01L 39/02
[52] U.S. Cl. .................... 257/777; 257/724; 257/783
[58] Field of Search .......... 257/685, 686, 700, 67, 257/83, 723, 724, 777, 782; 437/208

[56] References Cited

U.S. PATENT DOCUMENTS

| | | | |
|---|---|---|---|
| 3,851,221 | 11/1974 | Beaulleu et al. | 317/100 |
| 4,103,318 | 7/1978 | Schwede | 361/388 |
| 4,361,261 | 11/1982 | Elles et al. | 228/103 |
| 4,444,349 | 4/1984 | Bilane et al. | 228/102 |
| 4,567,643 | 2/1986 | Droguet et al. | 257/777 |
| 4,586,642 | 5/1986 | Dreibelbis et al. | 228/4.5 |
| 4,730,232 | 3/1988 | Lindberg | 361/381 |
| 4,763,188 | 8/1988 | Johnson | 257/777 |
| 4,982,265 | 1/1991 | Watannabe et al. | 357/75 |
| 5,025,306 | 6/1991 | Johnson et al. | 357/75 |
| 5,040,052 | 8/1991 | McDavid | 357/80 |
| 5,140,404 | 8/1992 | Fogal et al. | 357/70 |
| 5,172,215 | 12/1992 | Kobayashi et al. | 257/724 |
| 5,176,311 | 1/1993 | Levine et al. | 228/179 |
| 5,177,032 | 1/1993 | Fogal et al. | 437/220 |

FOREIGN PATENT DOCUMENTS

| | | | |
|---|---|---|---|
| 62-126661 | 6/1987 | Japan | 257/686 |
| 63-128736 | 6/1988 | Japan | 257/686 |
| 63-244654 | 10/1988 | Japan | 257/724 |
| 4-56262 | 2/1992 | Japan | 257/686 |

Primary Examiner—Jerome Jackson
Assistant Examiner—John F. Guay
Attorney, Agent, or Firm—Wells, St. John, Roberts, Gregory & Matkin

[57] ABSTRACT

A multichip module includes: a) a multichip module substrate; b) a first chip, the first chip having opposed base and bonding faces, the base face being adhered to the multichip module substrate, the first chip bonding face including a central area and a plurality of bonding pads peripheral to the central area; c) a second chip, the second chip having opposed base and bonding faces, the second chip bonding face including a central area and a plurality of peripheral bonding pads; d) a first/second adhesive layer interposed between and connecting the first chip bonding face and the second chip base face, the first/second adhesive layer having a thickness and a perimeter, the perimeter being positioned within the central area inside of the peripheral bonding pads; e) a plurality of first loop bonding wires bonded to and between the respective first chip bonding pads and the multichip module substrate, the respective first bonding wires having outwardly projecting loops of a defined loop height, the thickness of the adhesive layer being greater than the loop height to displace the second chip base face in a non-contacting relationship above and with respect to the first wires; and f) a plurality of second loop bonding wires bonded to and between the respective second chip bonding pads and the multichip module substrate.

5 Claims, 5 Drawing Sheets

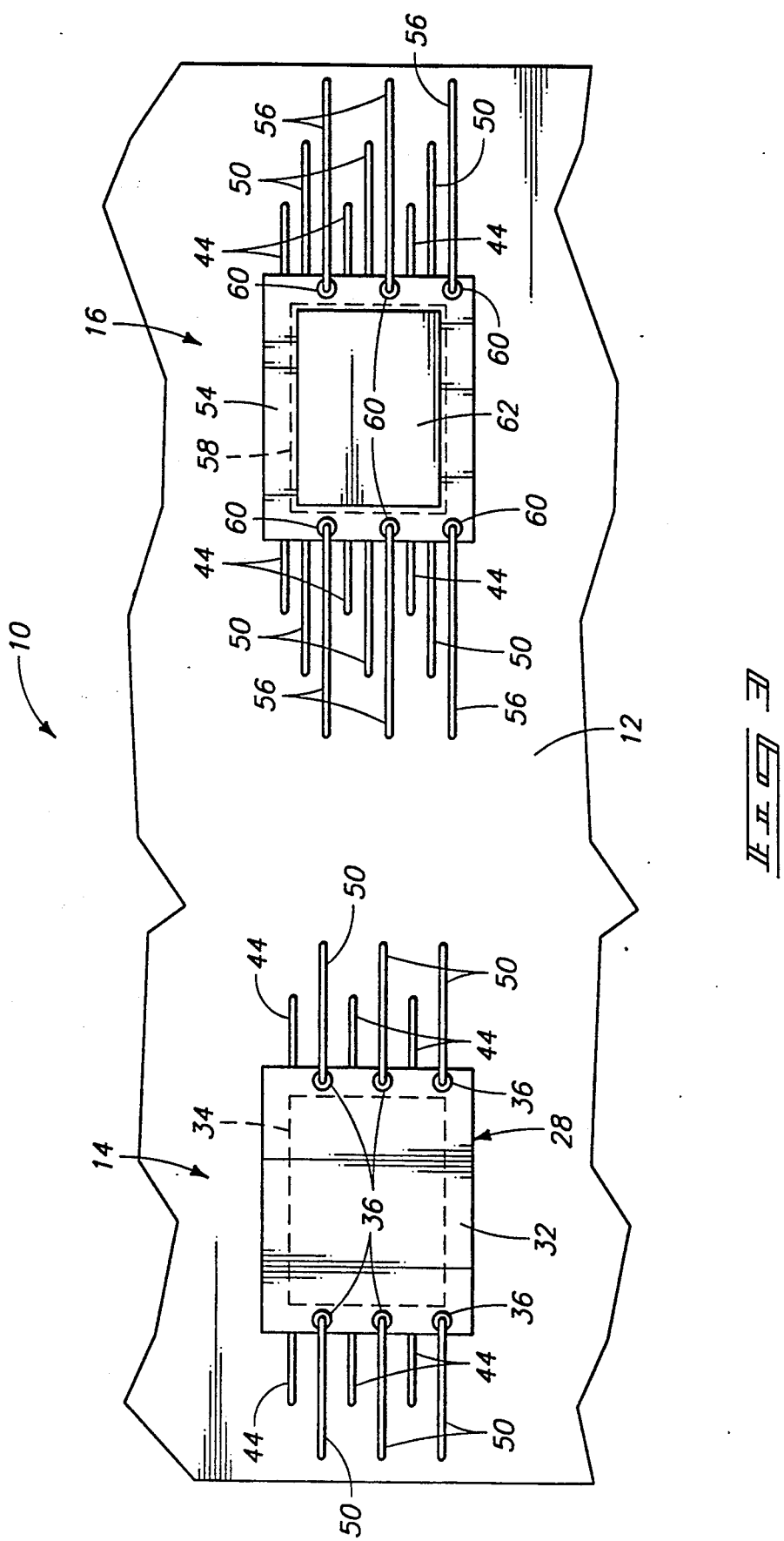

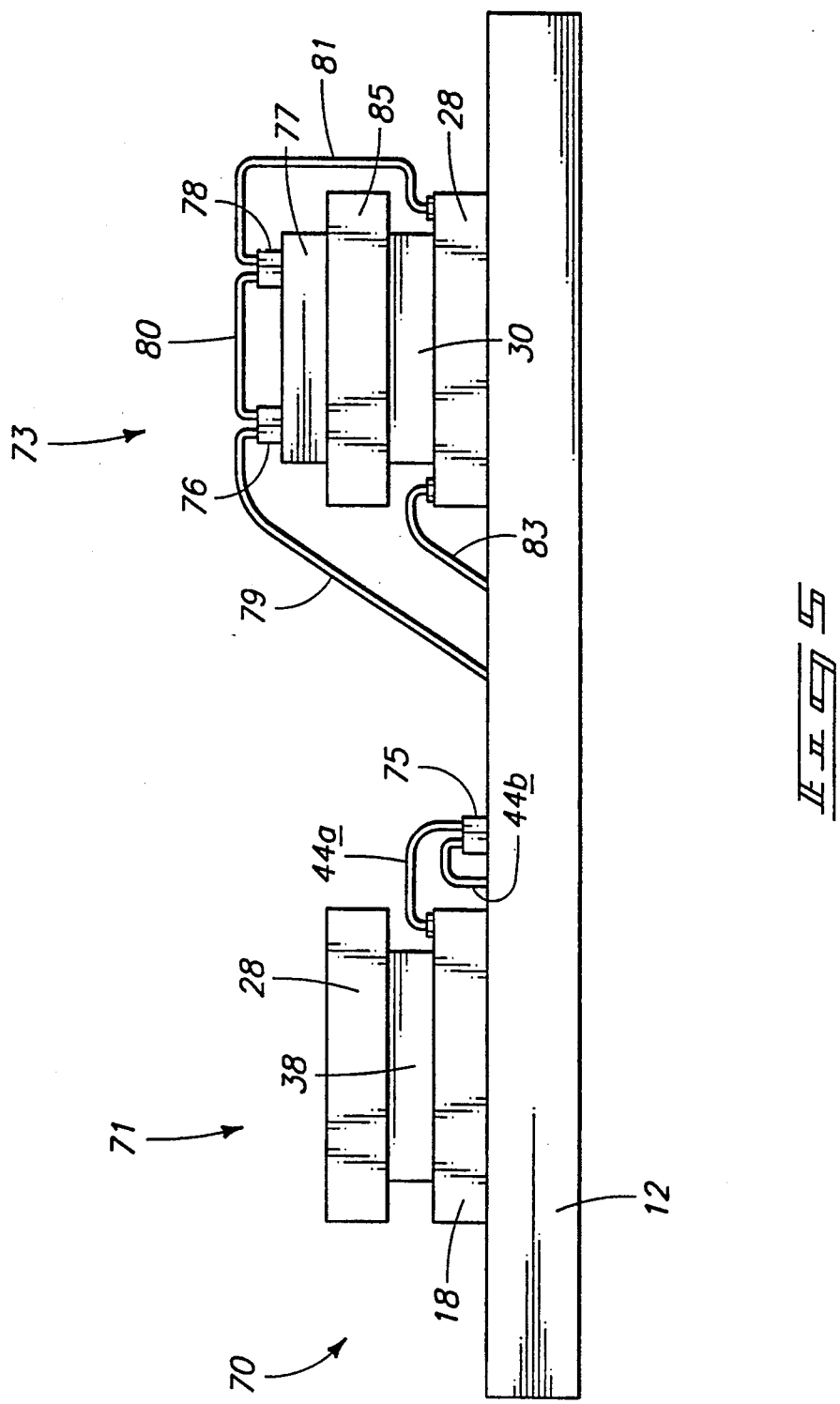

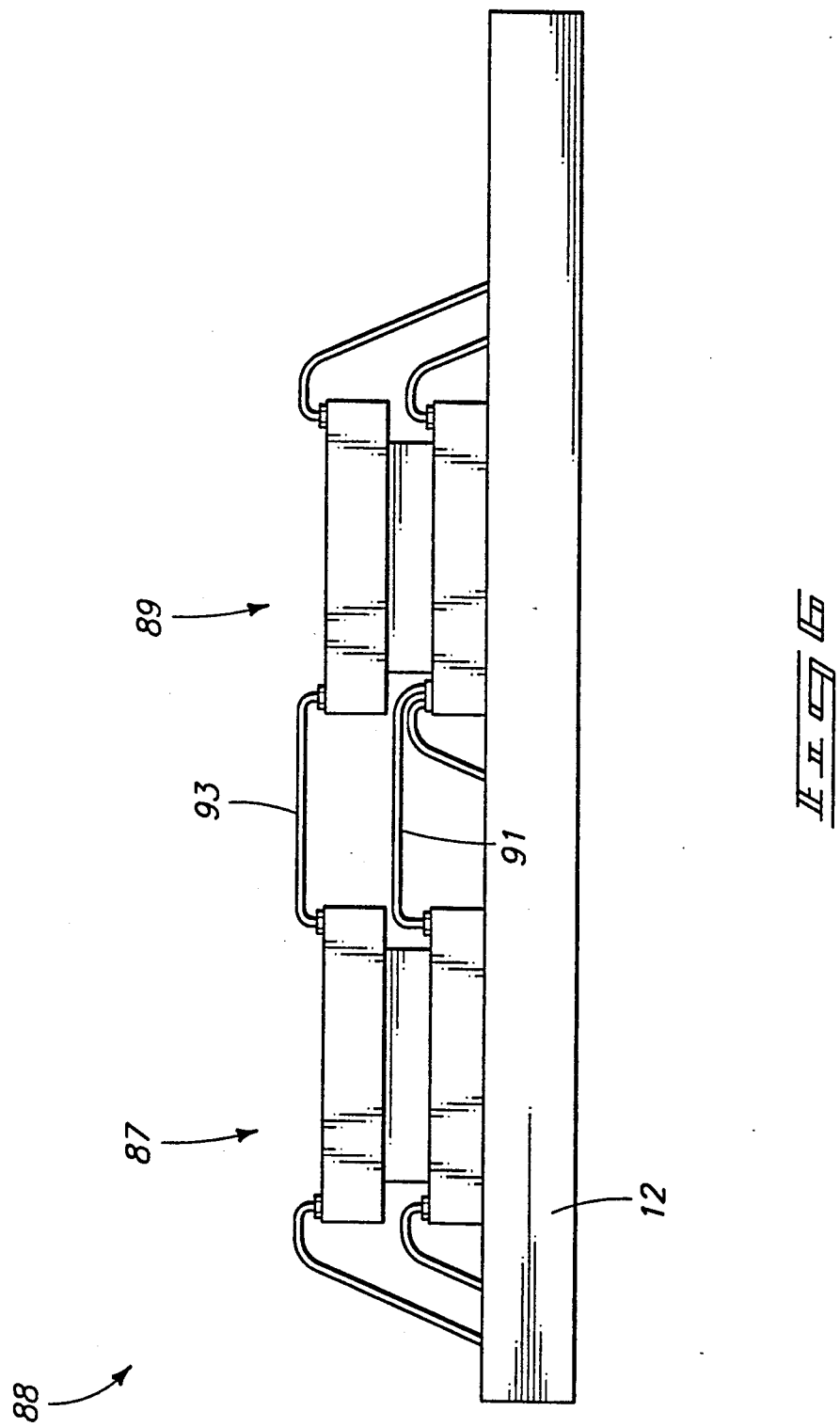

MULTICHIP MODULE HAVING A STACKED CHIP ARRANGEMENT

TECHNICAL FIELD

This invention relates specifically to wire bonding of multichip modules to multichip module substrates.

BACKGROUND OF THE INVENTION

Considerable advancement has occurred in the last fifty years in electronic development and packaging. Integrated circuit density has and continues to increase at a significant rate. However by the 1980's, the increase in density in integrated circuitry was not being matched with a corresponding increase in density of the interconnecting circuitry external of circuitry formed within a chip. Many new packaging technologies have emerged. One specific technology is referred to as "multichip module" technology. This invention concerns the specific art area of multichip modules.

In many cases, multichip modules can be fabricated faster and more cheaply than by designing new substrate integrated circuitry. Multichip module technology is advantageous because of the density increase. With increased density comes equivalent improvements in signal propagation speed and overall device weight unmatched by other means. Current multichip module construction typically consists of a printed circuit board substrate to which a series of integrated circuit components are directly adhered.

There are further a number of distinct art areas associated with how a substrate adhered circuit of a multichip module is electrically externally connected to circuitry on the substrate. These art areas include wire bonding, tape automated bonding (TAB), flip-TAB and flip-chip. This invention is specific to the distinct art area of wire bonding associated with multichip modules.

BRIEF DESCRIPTION OF THE DRAWINGS

Preferred embodiments of the invention are described below with reference to the following accompanying drawings.

FIG. 3 is a diagrammatic top view of the FIG. 1 multichip module.

FIG. 5 is a diagrammatic side elevational view of a further alternate multichip module in accordance with the invention.

FIG. 6 is a diagrammatic side elevational view of still a further alternate multichip module in accordance with the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with an aspect of the invention, a multichip module comprises:

a multichip module substrate;

a first chip, the first chip having opposed base and bonding faces, the base face being adhered to the multichip module substrate, the first chip bonding face including a central area and a plurality of bonding pads peripheral to the central area;

a second chip, the second chip having opposed base and bonding faces, the second chip bonding face including a central area and a plurality of peripheral bonding pads;

a first/second adhesive layer interposed between and connecting the first chip bonding face and the second chip base face, the first/second adhesive layer having a thickness and a perimeter, the perimeter being positioned within the central area inside of the peripheral bonding pads;

a plurality of first loop bonding wires bonded to and between the respective first chip bonding pads and the multichip module substrate, the respective first bonding wires having outwardly projecting loops of a defined loop height, the thickness of the adhesive layer being greater than the loop height to displace the second chip base face in a non-contacting relationship above and with respect to the first wires; and a plurality of second loop bonding wires bonded to and between the respective second chip bonding pads and the multichip module substrate.

Figure 1:
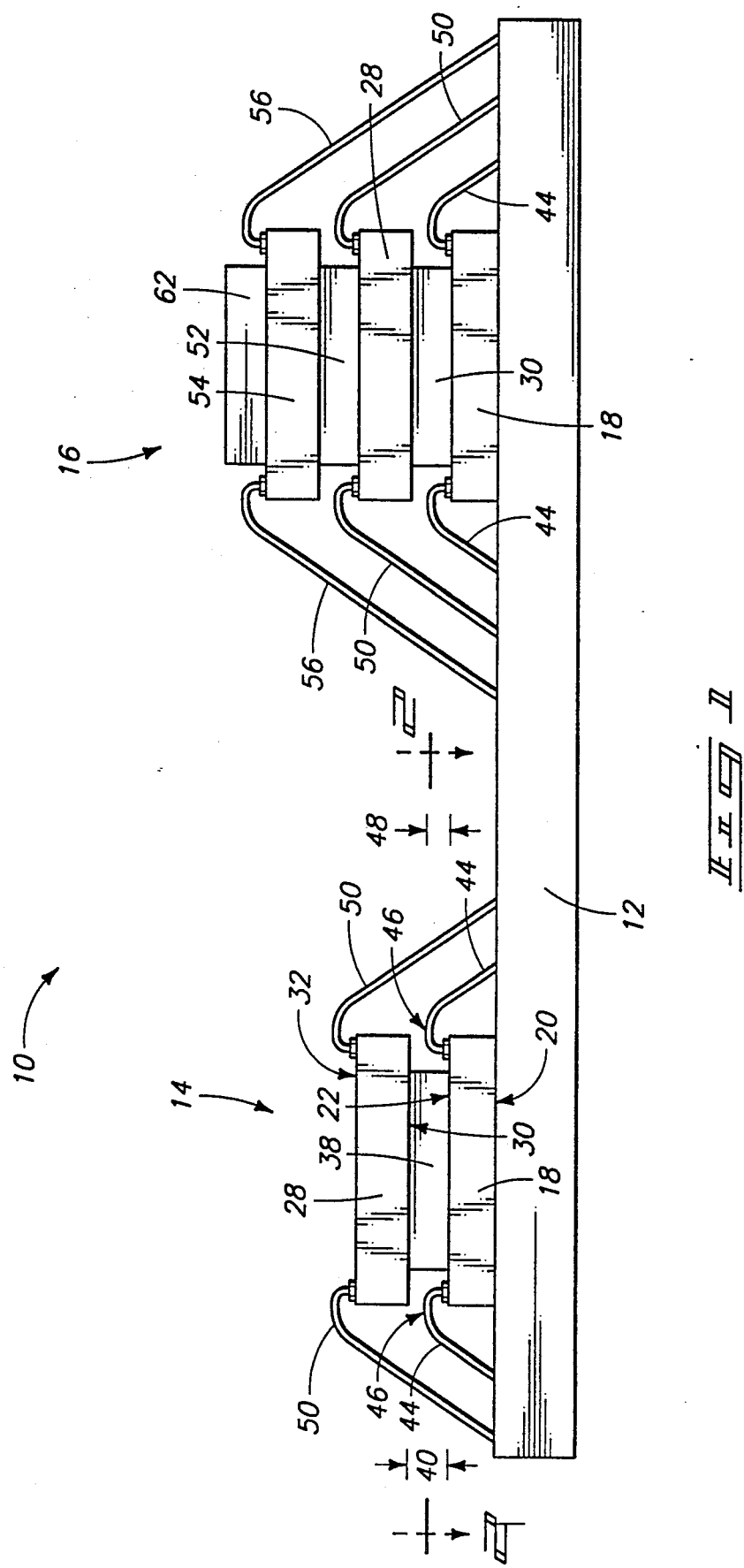
FIG. 1 is a side elevational view of a multichip module in accordance with the invention.
Figure 2:
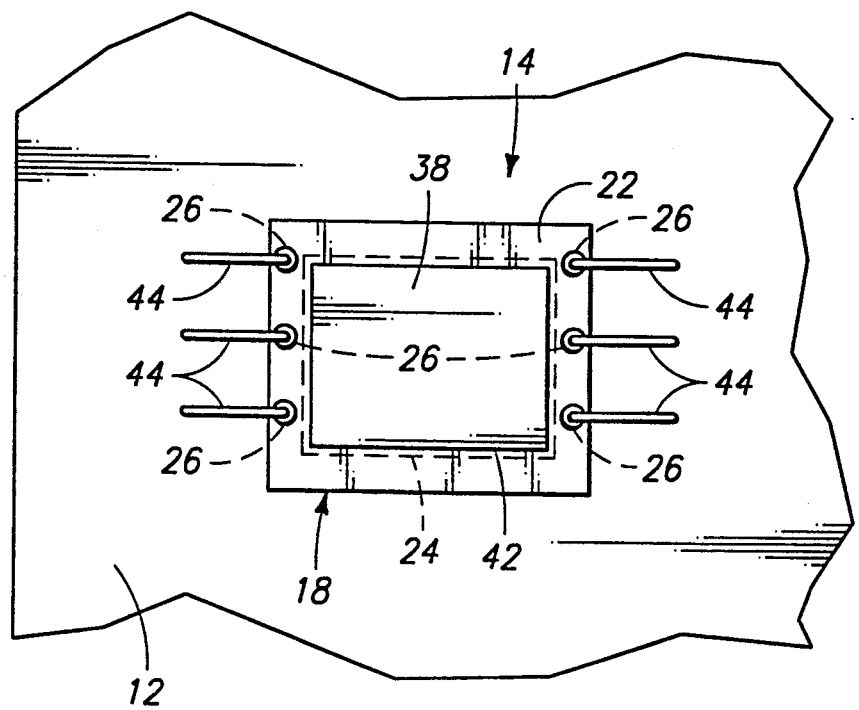
FIG. 2 is a diagrammatic top view of a portion of the FIG. 1 multichip module showing one chip stack as would be taken through line 2—2 in FIG. 1.

More specifically and first with references to FIGS. 1-3, a multichip module is indicated generally with reference numeral 10. Such is comprised of a conventional multichip module substrate 12 which is fabricated to comprise a plurality of z-direction multichip stacks 14 and 16. Referring first to stack 14, such includes a first chip 18 having opposed base and bonding faces 20 and 22, respectively. Base face 20 is adhered to multichip module substrate 12 by means of an adhesive, such as epoxy, thermoplastic materials, tape, tape coated with thermoplastic materials, etc. First chip bonding face 22 includes a central area 24 and a plurality of bonding pads 26 which are peripheral to central area 24.

Multichip stack 14 also includes a second chip 28 having opposed base and bonding faces 30, 32, respectively. Second chip bonding face 32 includes a central area 34 and a plurality of bonding pads 36 peripheral to central area 34.

A first/second adhesive layer 38 is interposed between and connects first chip bonding face 22 and second chip base face 30. First/second adhesive layer 38 has a thickness 40 and is deposited to define an adhesive perimeter 42, with perimeter 42 being positioned within central area 24 inside of peripheral bonding pads 26.

A plurality of first loop bonding wires 44 is bonded to and between respective first chip bonding pads 26 and multichip module substrate 12. First bonding wires 44 have outwardly projecting loops 46 having a defined loop height 48 between upper bonding surface 22 and the maximum extent of the loop. Thickness 40 of adhesive 38 is greater than loop height 48 to displace second chip base face 30 in a non-contacting relationship above and with respect to first bonding wires 44. A plurality of second loop bonding wires 50 is bonded to and between respective second chip bonding pads 36 and multichip module substrate 12.

Example materials for adhesive 38 include epoxies and tape. Most preferred is a thermoplastic tape such as is disclosed in our U.S. Pat. Nos. 5,140,404 and 5,177,032, which are hereby incorporated by reference. An example dimension for the adhesive layer thickness is 0.008 inch, while an example and typical defined loop height is 0.006 inch. An example of wire bonding equipment capable of producing such wire bonds and loops is the model 1484 XQ manufactured by Kulicke and Soffa Industries Inc. of Willow Groove, Pa. Adhesive 38 preferably comprises an electrically insulating material. Wires 44 and 50 can be provided bare or be externally insulated between there respective connections to the chip bonding pads and multichip module substrate.

Second multichip stack is substantially similar to first stack 14, and includes a subsequent second/third adhesive layer 52 and third chip 54. Thus, at least one additional adhesive layer and at least one additional chip is mounted outwardly relative to the second chip bonding face. Such third chip includes a plurality of third chip bonding wires 56. Third chip 54 includes a central area 58 and associated peripheral bonding pads 60 which connect with third loop wires 56. Third chip 54 also includes an overlying adhesive layer 62. Such provides a level of additional protection to the top-most chip in a multichip stack. Thus, third chip 54 can be considered as an outermost chip, with second/third adhesive layer 52 and/or second chip 28 and/or first/second adhesive 38 being considered as intervening material interposed between the first chip bonding face and the outermost chip base face.

Figure 4:
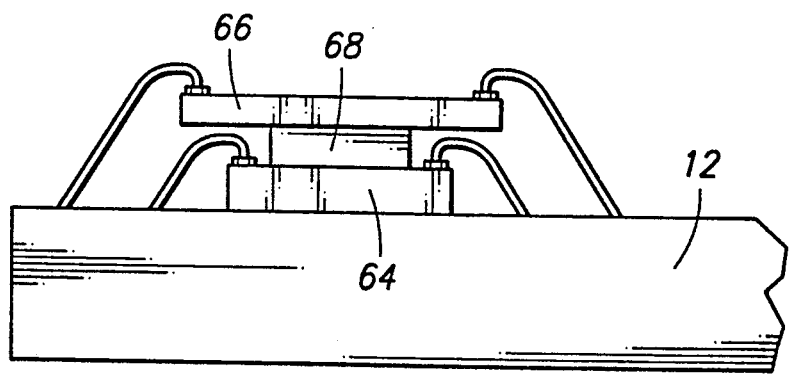
FIG. 4 is a diagrammatic side elevational view of an alternate embodiment multichip module in accordance with the invention.

The multichip module stacks of FIGS. 1-3 each include a plurality of chips of the same size and correspondingly having the same face surface areas. In accordance with another aspect of the invention, chips having different size surface areas are provided in a multichip module substrate. Referring specifically to FIG. 4, there illustrated is a first chip 64, second chip 66 and an intervening adhesive layer 68. As is apparent, the size and associated surface area of chip 66 is larger than that of chip 64. Alternately, chip 66 could be provided as a first or base chip adhered to multichip module substrate 12, with smaller chip 64 mounted there atop by adhesive.

FIGS. 5 and 6 illustrate further alternate aspects of the invention. FIG. 5 represents a multichip module substrate having wires which are indirectly bonded to the substrate through intervening discrete electronic components. Specifically, FIG. 5 illustrates a multichip module fragment 70 having a pair of z-direction stacks 71 and 73. Such stacks are similar to the z-direction stacks described with reference to FIGS. 1-3, such that only pertinent differences are emphasized in FIG. 5 and referred to below. With respect to stack 71, a discrete electronic component 75, such as a resistor, transistor, etc., is mounted by adhesive on multichip module substrate 12. A single first loop bonding wire 44a bonds to discrete component 75, while a second wire 44b bonds from discrete component 75 to bulk multichip module substrate 12. Thus, a first loop wire bonds between first chip 18 and bulk substrate 12 indirectly through discrete electronic component 75 mounted on multichip module substrate 12. Alternate wires interconnecting chips 28 and 18 with one another or substrate 12 would also typically be provided, but are not shown for clarity.

The z-direction stack 73 is similar in construction to z-direction stack 71, and illustrates a pair of discrete electronic components 76 and 78 adhered by means of an adhesive layer 77 to an uppermost chip 85. A wire 79 bonds between multichip module substrate 12 and discrete component 76. Another wire 80 bonds between discrete component 76 and discrete component 78. Still a further wire 81 bonds between discrete component 78 and a bonding pad on chip 28. Another wire 83 is shown bonding from another bonding pad on chip 28 to multichip module substrate 12.

FIG. 6 illustrates another alternate multichip module 88. Such also includes a pair of z-direction stacks 87 and 89. A first wire 91 interconnects and bonds between bonding pads of the first chips of each stack 87 and 89, respectively. Further, a second wire 93 bonds with and extends between bonding pads on the outermost chips of stacks 87 and 89, respectively. Other wires are shown bonding from the respective chips to substrate 12.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A multichip module comprising:
   a multichip module substrate;
   a first chip, the first chip having opposed base and bonding faces, the base face being adhered to the multichip module substrate, the first chip bonding face including a central area and a plurality of bonding pads laterally peripheral to the central area;
   a second chip, the second chip having opposed base and bonding faces, the second chip bonding face including a central area and a plurality of peripheral bonding pads;
   an adhesive layer interposed between and connecting the first chip bonding face and the second chip base face, the adhesive layer having a thickness and a lateral perimeter, the lateral perimeter being positioned entirely within the central area inside of the peripheral bonding pads;
   a plurality of first loop bonding wires bonded to and between the respective first chip bonding pads and the multichip module substrate, the respective first loop bonding wires having outwardly projecting loops of a defined loop height, the loop height being defined by the distance between the first chip bonding face and the vertexes of the outwardly projecting loops of the first loop bonding wires, the thickness of the adhesive layer being greater than the loop height to displace the second chip base face in a non-contacting relationship above and with respect to the first wires; and
   a plurality of second loop bonding wires bonded to and between the respective second chip bonding pads and the multichip module substrate.

2. The multichip module of claim 1 wherein the adhesive comprises a tape.

3. The multichip module of claim 1 wherein the adhesive comprises a tape coated with thermoplastic material.

4. The multichip module of claim 1 wherein the first chip, adhesive and second chip comprise a z-direction multichip stack, the multichip stack having a top-most chip, the top-most chip having a bonding face including a central area and a plurality of bonding pads laterally peripheral to the central area, the multichip module further comprising:

an overlying adhesive layer adhered to the top-most chip bonding face, the overlying adhesive layer having a lateral perimeter, the lateral perimeter being positioned entirely within the top chip central area inside of the peripheral top chip bonding pads.

5. The multichip module of claim 1 wherein the first chip, adhesive and second chip comprise a z-direction multichip stack, the multichip stack having a top-most chip, the top-most chip having a bonding face including a central area and a plurality of bonding pads laterally peripheral to the central area, the multichip module further comprising:

an overlying adhesive layer adhered to the top-most chip bonding face, the overlying adhesive layer having a lateral perimeter, the lateral perimeter being positioned entirely within the top chip central area inside of the peripheral top chip bonding pads; and the adhesive and the overlying adhesive comprising a tape.

* * * * *